United States Patent [19]

McAllister et al.

[11] Patent Number: 4,734,046
[45] Date of Patent: Mar. 29, 1988

[54] COAXIAL CONVERTER WITH RESILIENT TERMINAL

[75] Inventors: Michael F. McAllister, Clintondale; Alfred Mack, Poughkeepsie, both of N.Y.

[73] Assignee: International Business Machines Corporation, Armonk, N.Y.

[21] Appl. No.: 840,992

[22] Filed: Mar. 14, 1986

Related U.S. Application Data

[63] Continuation of Ser. No. 652,985, Sep. 21, 1984, abandoned.

[51] Int. Cl.$^4$ .............................................. H01R 4/66
[52] U.S. Cl. ...................................... 439/101; 439/63; 439/581; 439/482
[58] Field of Search ............. 339/177 R, 177 E, 17 C, 339/17 LM, 17 M, 255 R, 108 TP, 143 R, 147 R; 324/158 F, 158 P

[56] References Cited

U.S. PATENT DOCUMENTS

| | | | |
|---|---|---|---|
| 2,879,491 | 3/1959 | Shapiro | 339/17 M |
| 3,267,333 | 8/1966 | Schultz | 339/17 M |
| 3,551,874 | 12/1970 | Volinskie | 339/177 R |
| 3,566,334 | 2/1971 | Ziegler | 339/177 R |
| 3,676,776 | 7/1972 | Bauer et al. | 324/72.5 |
| 3,725,849 | 4/1973 | Becke | 339/177 R |
| 3,781,724 | 12/1973 | Moore et al. | 339/143 R |
| 3,806,801 | 4/1974 | Bove | 324/72.5 |
| 3,866,119 | 2/1975 | Ardezzone et al. | 324/158 F |
| 3,911,361 | 10/1975 | Boye et al. | 324/158 P |
| 3,963,986 | 6/1976 | Morton et al. | 324/158 F |
| 4,012,095 | 3/1977 | Doucet et al. | 339/177 R |
| 4,038,599 | 7/1977 | Bove et al. | 324/158 F |
| 4,168,873 | 9/1979 | Luna | 339/108 TP |
| 4,193,082 | 3/1980 | Dougherty | 357/80 |
| 4,202,007 | 5/1980 | Dougherty et al. | 357/80 |
| 4,231,629 | 11/1980 | Kirby | 339/177 E |
| 4,281,888 | 8/1981 | Seaman | 339/108 TP |
| 4,340,858 | 7/1982 | Malloy | 324/158 P |
| 4,588,241 | 5/1986 | Ardezzone | 339/177 R |
| 4,603,926 | 8/1986 | Nesbit et al. | 339/177 R |

OTHER PUBLICATIONS

IBM Technical Disclosure Bulletin, Conformal Multi-Probe Tester Assembly, by D. O. Powell and J. Rasile, vol. 24, No. 7A, Dec. 1981.

*Primary Examiner*—Gil Weidenfeld
*Assistant Examiner*—David Pirlot
*Attorney, Agent, or Firm*—Perman & Green

[57] ABSTRACT

A system of interconnection of a set of coaxial cables to a device, such as a testing apparatus for an integrated circuit chip, includes an apertured plate of electrically conducting material which positions each of the connectors in registration with corresponding terminals of the device. Each connector includes a spring-loaded probe insulated from a housing of the connector and making connection between an inner conductor of a coaxial cable and the corresponding terminal of the device. Also included are signal-return spring-loaded probes mounted in the plate and electrically connected thereby to the other conductors of the coaxial cables to provide signal-return paths with corresponding terminals of the device. In alternative embodiments, a simpler connection is fashioned by use of a single connector and a single signal-return probe extending from a shoulder of the housing of the connector. Also, a pair of cables can be joined by use of a cylindrical sleeve enveloping a pair of opposed connectors and making electrical contact with the housings thereof.

16 Claims, 6 Drawing Figures

COAXIAL CONVERTER WITH RESILIENT TERMINAL

This is a continuation of co-pending application Ser. No. 652,985 filed on Sept. 21, 1984, now abandoned.

The present application is related to co-pending patent application Ser. No. 652,981, entitled "Space Transformer and Rigid Test Probe", filed on Sept. 21, 1984, and of common assignee herewith.

BACKGROUND OF THE INVENTION

This invention relates to electrical connectors and, more particularly, to a coaxial connector having a central spring-loaded pin electrode encircled by a circumferential shoulder electrode in which spring-loaded contact pins may be mounted.

Coaxial cables are widely used in the transmission of electric signals. Such cables have an inner conductor disposed along the axis of the cable, and an outer conductor disposed circumferentially about the inner conductor in the manner of a shield or sleeve. The inner and other conductors are spaced apart by a coaxial layer of insulating material of suitable dielectric characteristics for establishing a desired impedance to the cable. Such cables are manufactured in a large variety of sizes including both large and smaller diameters. Connectors at the termini of the cables maintain the coaxial configuration in the arrangement of the connector components. The connectors are usually structured as male and female counterparts and include a locking device, such as a spatial groove and tooth, for secure engagement of connectors to each other.

There is particular interest in the use of coaxial cables in the testing of semiconductor microcircuits. In a complex circuit, there may be many terminals which are to be connected to testing apparatus and, accordingly, many cables are to be employed in the connection of the semiconductor microcircuit to the testing apparatus. In the case of the testing of microcircuits formed as chips with electrodes in the form of pads, the sizes of the pads and their spacing are too small to connect with even the smallest sizes of coaxial cable. Accordingly, devices have been constructed which interface between a set of pads and coaxial cable connectors.

A problem attendant the use of such interfacing devices is the compromise between bandwidth and the physical size of the device necessary to accommodate standard coaxial connectors. Thus, the physical size of presently available coaxial connectors places restraints on the construction of the interfacing device. This may be readily appreciated because the interfacing device esentially transforms the spatial array of the microcircuit pads to the spatial array of the coaxial connectors.

Even if the pads of the microcircuit were enlarged, no direct connection could be made between the connector and the pad because presently available connectors are not configured for mating with a flat surface.

SUMMARY OF THE INVENTION

The foregoing problems are overcome and other advantages are provided by a coaxial connector which, in accordance with the invention, comprises a spring-loaded pin-shaped contact disposed in the center of the connector and an enlarged circumferential element which surrounds a central contact. The central contact connects with the inner conductor of a coaxial cable, and the circumferential element connects with outer conductor of the coaxial cable. The circumferential element serves as a housing for one or more outer contacts which are spring loaded and pin shaped, the outer contacts being electrically connected to the outer conductor via the circumferential element. The spring loading provides resiliency which permits the contacts to retract into the connector via movements parallel to the axis of the connector. The foregoing arrangement of the contacts permits connection to be made with a flat array of opposed contacts without the need for any manual twisting of the connector to secure a connection. That is a resultant substantial savings in space which permits increased freedom in the design of one of the foregoing interface devices.

In accordance with a further feature of the invention, a group of the connectors can be ganged together and held in position by a common plate having apertures for engagement with the connectors, and by which the respective cables have access to the connectors.

In an alternative embodiment of the invention, two connectors are coupled with the aid of a sleeve that encompasses and positions the two connectors. Thereby, two coaxial cables are readily joined without the necessity for manufacturing male and female types of connectors.

In a further embodiment of the invention, one outer contact is employed and the circumferential element is extended on one side of the connector to provide a finger grasp whereby the connector can be handled as a probe for testing electrical circuits. The central contact may be connected to a signal terminal, and the outer contact may be connected to a return terminal.

BRIEF DESCRIPTION OF THE DRAWINGS

The foregoing features and other aspects of the invention are explained in the following description taken in connection with the accompanying drawing, wherein like reference numerals indicate like parts throughout the figures, and wherein.

DETAILED DESCRIPTION OF THE INVENTION

A description of preferred embodiments of the invention is presented now, the description having two parts. First an interface device with advantageously employs the connectors of the invention will be described with reference to FIGS. 1 and 2. Then the remaining figures will be used for describing embodiments of the connector, the embodiment of FIG. 3 being particularly useful for the interface device. The interface device is presented in FIGS. 1 and 2 as a test fixture structure 10.

Figure 1:
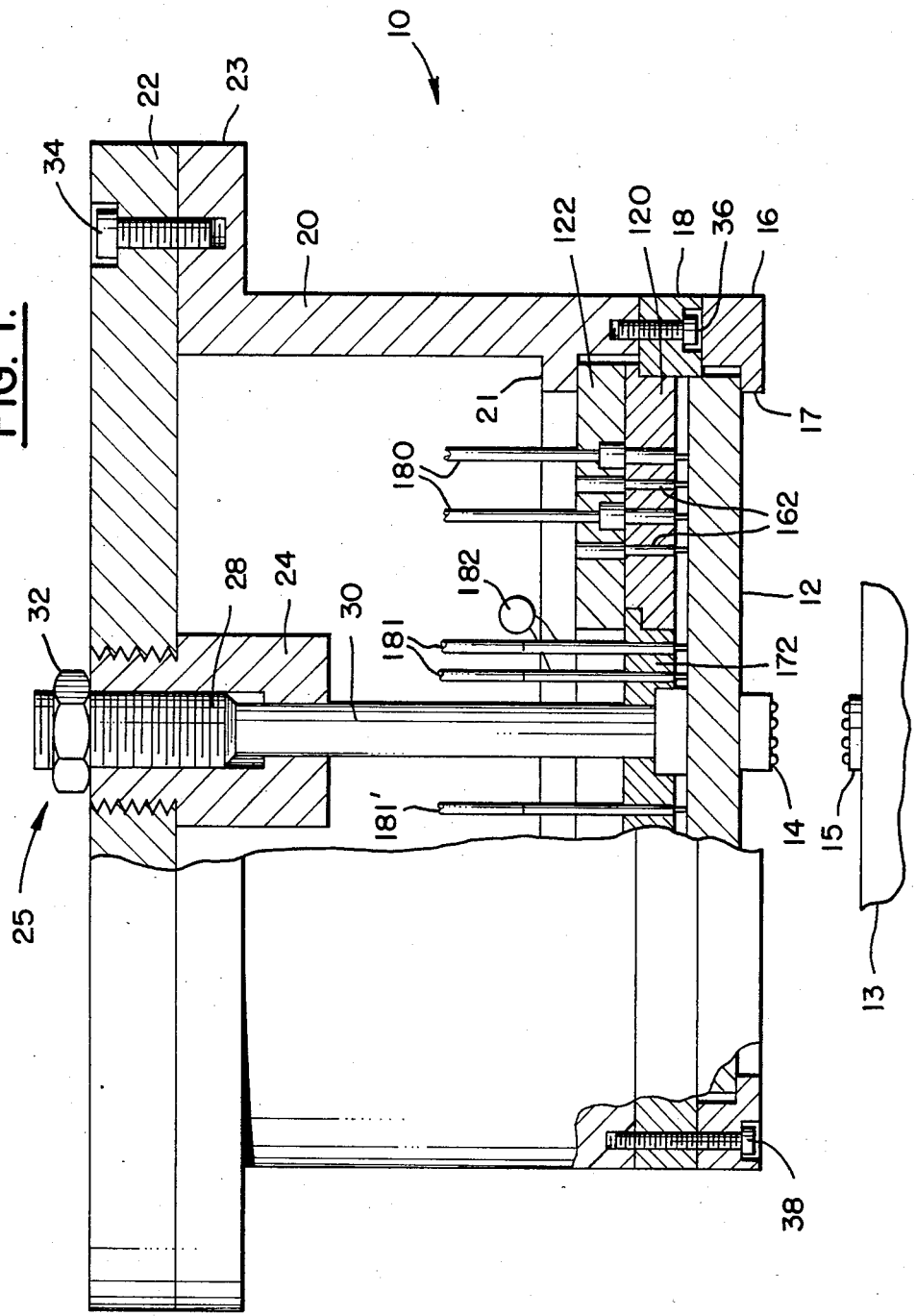
FIG. 1 is a partially sectioned side view of an interface device including a space transformer useful in the testing of an integrated microcircuit, the design of the space transformer serving as an example of a situation wherein a set of the coaxial connectors of the invention can be used to great advantage in the testing of semiconductor integrated circuits.
Figure 2:
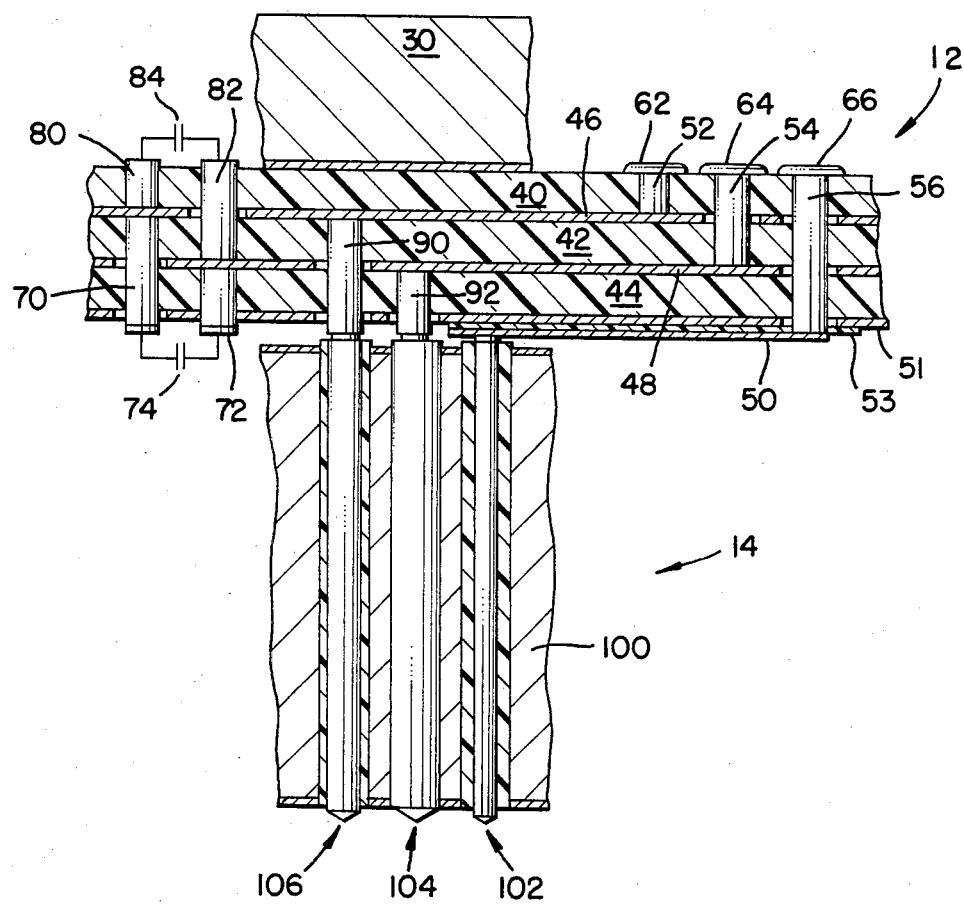
FIG. 2 is a detailed description side view of a portion of the space transformer and a rigid probe of the interface device of FIG. 1.

With reference to FIGS. 1 and 2, the test fixture structure 10 comprises a space transformer 12 with a probe assembly 14 depending therefrom for contacting terminal pads of an integrated circuit 15 positioned for testing on a holder shown, by way of example, as a flat 13. The structure 10, the transformer 12 and the probe 14 are provided each with square (or rectangular) form, the size of the probe 14 being much smaller than that of the transformer 12 so as to interface with the integrated circuit 15.

The structure 10 further comprises square connector plate 120, signal connector retainer plate 122, central connector plate 172, sidewall 20, and space transformer cap 16 and positioning nest 18. A detailed description of the construction and function of the space transformer 12 and rigid test probe 14 is provided in the above noted copending related application, which application is accordingly expressly incorporated herein by reference.

Considering the structure 10 now in greater detail, the square connector plate 120 is preferably of highly conductive metal, such as gold-plated brass, that is electrically connected to a ground reference potential. Openings provided essentially perpendicularly through the square connector plate 120 provide electrical connection with and position signal connectors 180 and ground connectors 162 therein. The connectors 162, 180 are described in greater detail with respect to FIG. 3 below. However, it is sufficient now to note that they are of a movable spring-loaded type of construction providing a center conductor that is compressively spring loaded. Thus, the conductive interface between the connectors 162, 180 and the connector plate 120 serves to provide the shortest, least resistive ground connection path to the connectors 162, 180. The connectors 162 preferably are press fit within openings of the plate 120 to ensure their proper retention in the square connector plate 120.

Power connectors 181 are similarly press fitted into openings extending essentially perpendicularly through the central connector plate 172. The central connector plate 172 significantly differs from the square connector plate 120 in that it is formed preferably of an excellent dielectric material having significant structural strength, such as AF DELRIN. Thus, the design and construction of the power connectors 181 is simplified, since no additional insulator is required. The central connector plate 172 is generally square shaped and preferably dimensioned to fit within a central opening of the square connector plate 120 and around a central brace 30 substantially as shown in FIG. 1. The power connectors 181 are not integrally shielded and, accordingly, decoupling capacitors 182 may be connected easily with sufficiently short connection leads to avoid the introduction of undesirable parasitic inductances.

The signal connector retainer plate 122 sets upon the connector plate 120 and overlaps a portion of the connector plate 172 for retaining these plates in their respective positions. Retainer plate 122 is constructed preferably of a dielectric material such as AF DELRIN having sufficient structural strength to retain the central and square connector plates 120, 172.

Holes 124, 126 (best shown in FIG. 3) are preferably provided essentially perpendicularly through the retainer plate 122 to allow wire leads to pass therethrough as necessary to reach the signal connector 180 and provide body clearance for ground connector 162. These openings for signal connector 180 are preferably counterbored to fit over flanges provided on the connector outer surfaces. These flanges, as will be described in greater detail below with regard to FIG. 3, not only act to establish the depth that the connector 180 may be press fitted into the square connector plate 120, but also permit the connector retainer plate 122 to provide as strain relief for the connector lead wires. Openings may also be provided in the signal connector retainer plate 122 as necessary to allow the upper portion of the ground connectors 162 to extend unobstructed above the square connector plate 120.

The sidewall 20, constructed preferably of a light weight structural aluminum alloy, includes a flange 23 for attachment by several screws 34 to a support bridge 22. A screw assembly 25 comprises an internally threaded insert 24, a screw 28 mating therewith, and a locking nut 32, the assembly being provided at the center of the bridge 22 to apply pressure adjustably to the brace 30. A flange 21 is provided on the inner surface of the sidewall 20 and extends sufficiently inward to contact the upper edge surface of the plate 122, substantially as shown in FIG. 1. The transformer positioning nest 18 is attached to the bottom end of the sidewall 20 by several counterbored screws 36, and extends inwardly of the sidewall 20 to contact a bottom edge portion of the square connector plate 120 to secure the positioning of the retainer 122. The transformer cap 16 is formed of a set of retainer segments which, in turn, are attached through the positioner 18 to the sidewall 20 by several counterbored screws 38.

Each of the retainer segments of the cap 16 is provided with a flange 17 that extends inwardly to engage a bottom edge portion of the space transformer 12, substantially as shown. The dimensions of the cap 16 are preferably appropriate to secure the space transformer 12 with respect to the connector plates 120, 172 such that the upper surface of the space transformer is uniformly positioned along the bottom surface of the connector plates 120, 172.

In moving the space transformer 12 into close proximity with the connector plates 120, 172, the spring loaded central conductors of the various connectors are compressed into the bodies of their respective connectors, each preferably with a resistive force of approximately 10 grams initially and 20 grams ultimately, as will be described hereinafter with reference to FIG. 3. The gap between the space transformer 12 and the connector plates 120, 172 is preferably as small as practically possible to minimize the unshielded length of the center conductors of the signal probes 180 as they extend across the gap. This is desired to correspondingly reduce the degree of electrical discontinuity caused by the unshielded condition, as will be discussed in greater detail below.

Although not shown, the brace 30, square plates 120, and spacer nest 18 are preferably provided with interlocking dowels. By the proper selection of the placement of the dowels, the correct orientation of the connectors 162, 180, 181 can be insured effectively so as to properly contact electrodes on the top surface of the space transformer 12.

For purposes of completeness, a representative detail portion of the preferred space transformer 12 and probe assembly 14 is shown in FIG. 2. The structure of the space transformer 12 is set forth in the aforementioned copending patent application. Structural features thereof are repeated here so as to demonstrate the continuity of signal flow structure from the connectors 180, 162, 181 to the probe assembly 14. Thereby it can be appreciated that the structure of the connectors 180, 162, 181 allows broadband electromagnetic signal propagation to and from the space transformer 12 with minimal impedance mismatch.

The space transformer 12 is a multilayer ceramic (MLC) design fabricated using conventional ceramic layer laminate technology. The structure so formed preferably includes a minimum of three planar ceramic layers 40, 42, 44 separated by two highly conductive material layers 46, 48, preferably of a metal or metal alloy having a coefficient of expansion similar to that of the specific ceramic used. The first conductive layer 46 is preferably used as a power plane and the second as a power return or ground plane 48 for reasons that will be discussed in greater detail below.

A via provided in the layer 40 allows a conductive bus 52, preferably of a metal such as molybdenum, to extend between the layer 46, this being a power plane, and an electrode 62, preferably of gold or equivalent highly conductive, oxidation resistant metal or alloy, provided on the ceramic layer 40 external surface that will ultimately become the top surface of the space transformer 12. Similarly, a conductive bus 54 extends between the layer 48, this being a ground plane, and a surface electrode 64 through vias in the two interposed ceramic layers 40, 42 as well as through an appropriate opening in the power plane 46 needed to prevent shorting.

A desired plurality of signal buses 56 (only one is shown) are provided to conduct signals from electrodes 66 (only one electrode 66 shown in FIG. 2) present on the top surface of the space transformer 12 to one of many electrical conductors 50 formed as metallic film on the bottom surface of the transformer 12. The conductors 50 are spaced apart from the bottom surface of the ceramic layer 44 by another electrically-conductive metallic layer 51 and an electrically-insulating layer 53, the layer 53 being sandwiched between the conductors 50, and the layer 51, the latter contacting the ceramic layer 44. The buses 56 extend through respective vias in the ceramic layers 40, 42, 44 and openings in the power and ground planes (layers 46 and 48) as well as layers 51 and 53. Conventional thin film deposition techniques are used to provide the layer 51, which layer serves as a high frequency (greater than 50 MHz) AC ground reference layer overlying substantially all of the bottom surface of the space transformer 12. The thin film conductors 50 which are conductively coupled to respective signal buses 56 are patterned on the layer 53 as necessary to spatially interconnect to the signal conducting wires 102 of the probe assembly 14 described in greater detail below.

The probe assembly 14 generally includes a rigid structural body 100 of a conductive metal maintained at the ground reference potential. Also included are signal probes 102, each having a central conductor wire separated from the grounded body 100 by a dielectric coating to establish a coaxial signal line having a desired impedance (preferably 50 ohms), ground probes 104 that are intimately grounded to the body 100, and power probes 106 having a thin, insulating oxide layer covering a low impedance center conductor.

As shown, the signal probe 102, ground probe 104, and power probe 106 extend through the body 100 sufficiently for their distal probe points to appropriately contact respective signal, ground, and power native pads (typically C-4 solder bumps, not shown) of the integrated circuit 15. The proximal ends of the probes 102, 104, 106 are conductively connected to their respective planes of the conductors 50, the layer 48 and the layer 46 of the space transformer 12. That is, the power probe 106 conductively abuts a bus 90 extending from the power plane 46 to the bottom surface of the space transformer 12 through vias in the lower two ceramic layers 42, 44 and openings in the ground and wiring planes of elements 48, 51, 53 and 50. Similarly, a bus 92 conductively extends from the ground plane of layer 48 to the bottom surface of the space transformer 12 through a via in the bottom ceramic layer 44 and an opening in the planes of elements 50, 51 and 53 as necessary to connect to the ground probe 104. The signal probes 102 conductively connect, as an array thereof, directly to the set of conductors 50 by contacting the exposed surface of their respective thin film conductors 50.

The preferred structure of the space transformer 12 is essentially completed by the provision of low connection inductance, high-frequency decoupling capacitors 74, 84 extending between the planes of the power layer 46 and ground layer 48. The capacitors 74, 84 are preferably of a thin film construction and spatially positioned as desired on the top and bottom external surfaces of the space transformer 12. Connection of the capacitors 74, 84 is made to the power layer 46 and ground layer 48 by respective power 70, 80 and ground 72, 82 buses extending through vias in the ceramic layers 40, 42, 44 and corresponding openings in the power and ground layers 46, 48. The short length of connection between the capacitors 74, 84 and the power and ground layers 46, 48 and the use of a low inductance bus metal, such as molybdenum, results in minimum connection inductance. Naturally, the high-frequency behavior of the capacitors 74, 84 depends on the dimensions of the capacitor electrodes and dielectric parameters of the capacitor insulator material. The use of thin film capacitors attached to the surfaces of the space transformer 12 and connected by integral buses allows the capacitors to be placed at any convenient point and contributes to the realization of a unitary, easily manipulated structure.

The structure of the space transformer 12 constructed in accordance with the present invention significantly provides for an arrangement of the layers 46, 48, 51 and conductors 50 which may be regarded as a mesh plane array. The ground planes of layers 48, 51 interposed between the power plane of layer 46 and the thin film conductors 50, effectively shields the power plane and thin film conductors from one another. With respect to the power plane of layer 46, the provision of the low connection inductance decoupling capacitors stabilizes the high-frequency power voltage potential without significantly contributing to the generation of current noise (dI/dt). With respect to the thin film conductors 50, the provision of the reference ground plane of layer 51 further isolates and, by the proper selection of the dimensions of the thin film conductors 50 and the thickness of layer 53 according to standard transmission line theory, permits the characteristic impedance of the conductors 50 to be maintained at an optimal value, preferably fifty ohms. Thus, the impedance of the signal conductors 50 can be independently established at a value much higher than that of the power and ground planes (generally less than 1 ohm, and preferably less than 0.5 to 0.1 ohms).

Again referring to FIG. 1, the test structure 10 in operation positions the space transformer 12 with the attached probe assembly 14 in close proximity with the integrated circuit 15. As should be readily apparent to persons skilled in the art, the circuit 15 is preferably provided in its initial or native package and mounted in a suitable holder, here simply represented by the flat 13, so as to present and make accessible the array of native conductive pads of the circuit 15 to the rigid test probe 14 in a plane preferably parallel to the flat 13. The probe wires are preferably arrayed parallel to one another so as to orthogonally match the corresponding array, or footprint, of native contact pads of the integrated circuit 15. Correspondingly, the number of probe wires is preferably equal to or less than the number of native pads as necessary to provide power and test signals to the integrated circuit 15 and receive return signals therefrom. The space transformer 12 is then advanced toward the flat 13 until the tips of the probe wires encounter the pads of the integrated circuit with sufficient pressure to ensure proper electrical contact therebetween.

The brace 30, abutting the top surface of the space transformer 12 opposite the probe assembly 14, is effectively utilized to prevent the space transformer 12 from flexing as pressure is applied thereto by the sidewall 20. Naturally, the initially nominally flexed position of the space transformer 12 is set and subsequently maintained by adjustment of the screw assembly 25. After testing, the test structure 10 is backed off and the integrated circuit 15 can be removed undamaged.

Figure 3:
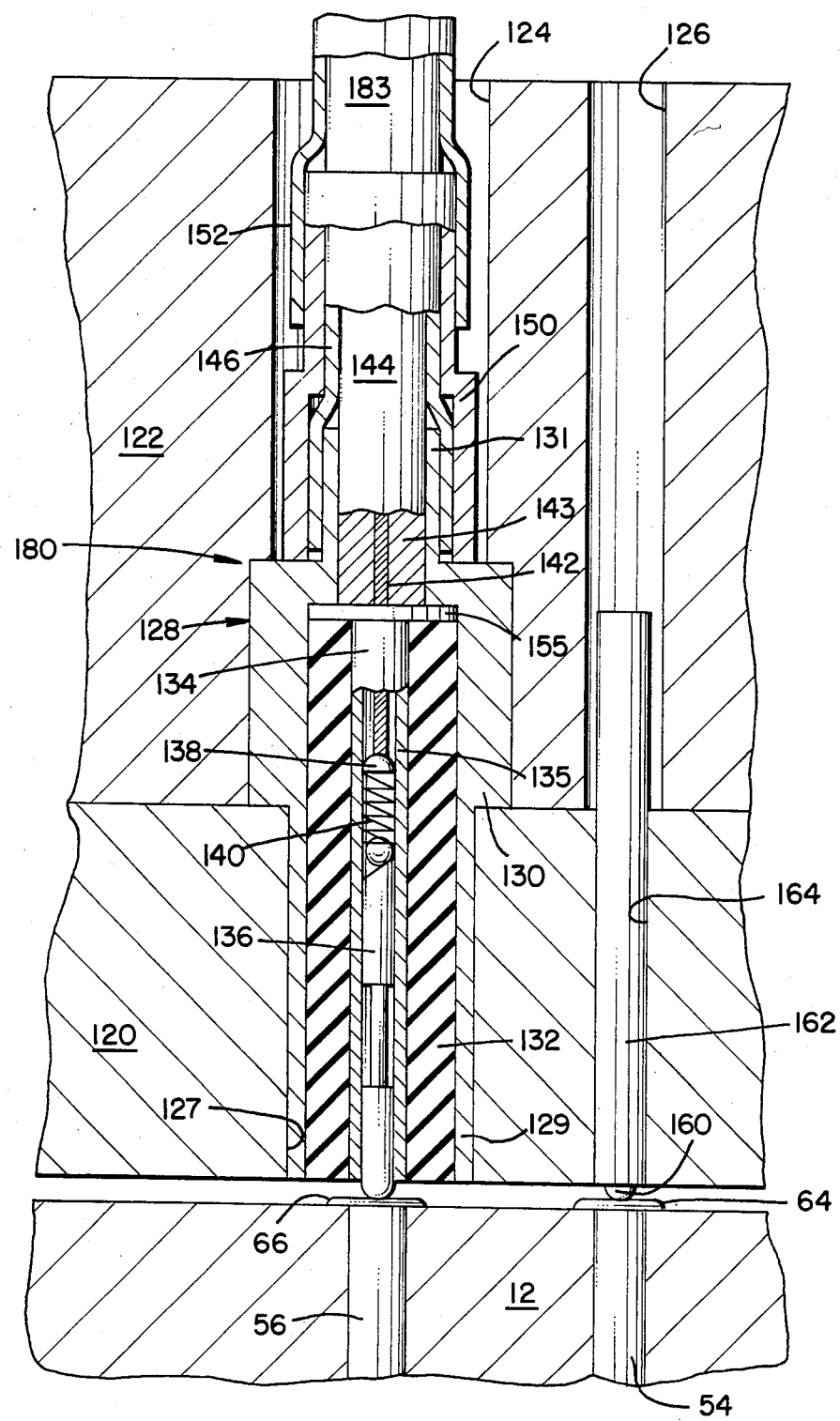
FIG. 3 is a detailed sectional side view of a coaxial connector incorporating the invention and connecting a coaxial cable to the interface device of FIG. 1.

Referring now to FIG. 3, there is shown a greatly expanded sectional view of one of the signal connectors 180 and an adjacent ground connector 162 in contact with their respective space transformer electrodes 66, 64, previously shown in FIG. 1. Central to the signal connector 180 is a spring-loaded probe 134 which is a modification of a probe marketed under the name of "POGO PROBE" with part number P-2784-3 by the PYLON Company of Attleboro, Mass., the modification being accomplished by fabricating the probe of non-inductive materials, such as berrilium copper, and reducing spring contacting force. The probe 134 has a body 135 which is a thin wall, conductive metal tube housing a center conductor or pin 136, metal stopper ball 138, and compression spring 140. A press fit insulator insert 132, preferably of Teflon TM, is provided coaxially about and extending the length of the probe 134. The insulator insert 132 is, in turn, press fitted into a body tube 128 of the connector 180, the tube 128 being constructed of a highly conductive metal, preferably gold plated brass, that forms the supporting shell of the signal connector 180. The body tube 128 preferably has a thin wall lower portion 129, a relatively thicker walled flange portion 130, and a thin walled upper portion 131, substantially as shown in FIG. 3.

The external dimensions of the lower portion 129 of the body tube 128 are selected preferably, to allow the secure press fitting of the lower portion into the hole 127 provided in the connector plate 120. As noted above, the flange portion 130 is of a relatively greater outer diameter forming a shoulder which establishes the depth that the end of the lower body tube portion 129 is inserted into the connector plate 120; i.e., preferably so as to be substantially flush with the bottom surface of the connector plate 120.

A small-diameter coaxial cable 183 such as the commercially available microdot TM cable is preferably used as the test lead attached to the probe 134 of the signal connector 180. The cable 183 generally includes a core 144 comprising a central signal line conductor 142 within a dielectric sheath 143, and a coaxial ground shield 146 enclosing the core 144. Connection to the probe 134 is accomplished by soldering or otherwise suitably attaching the extended end of the signal line conductor 142 into the hole in the upper terminus of the probe 134. The stopper ball 138 is an integral part of probe 134. The lower end of the dielectric sheath 143 is separated from the ground shield 146 and is inserted into the upper portion 131 of the body tube 128 so as to abut the top end of the probe 134. A washer of a dielectric material 155, directly beneath the sheath 143, closes off the top of the probe 134 and contacts the insulator insert 132. The ground shield 146 of the cable 183 is expanded around and extended the length of the upper body tube portion 131 and, therefore, is in conductive contact therewith. Consequentially, the ground shield 146 is effectively extended the full length of the probe 134 while the insulator insert 132 serves to electrically isolate the signal probe 134 from the grounded body tube 128 as well as to maintain the desired signal line impedance. The appropriate material of the insulator insert 132 and necessary radial thickness are selected in a well-known manner to obtain the desired signal line impedance.

A connector sleeve 150 is provided to essentially complete the signal connector 180. The sleeve 150, preferably of a conductive metal, is press fitted over that portion of the ground shield 146 of the cable 183 expanded over the upper tube portion 131 of the body tube 128. Thus, the attachment of the cable 183 to the body tube 128 is effectively secured so as to form an integral signal connector 180, substantially as shown in FIG. 3.

Finally, a shrink fit insulative coating 152 may be provided over the cable 183 and a portion of the sleeve 150 to substantially seal the connection of the cable 183 to the body tube 128 from deleterious environmental effects, such as corrosion.

As previously noted, the signal connector retainer plate 122 is provided with a counterbored hole 124 to receive the upper portion of the signal connector 180 and allow the test lead attached thereto to pass through. The counterbored portion of the hole 124 is specifically dimensioned to receive only the flange portion 130 of the body tube 128. Since the diameter of the remaining portion of the hole 124 is preferably less than that of the flange portion 130, the signal connector retainer plate 122 inherently functions as a strain relief.

The ground connector 162 is of essentially identical construction to the probe 134 of the signal connector 180. However, the ground probe 162 significantly differs in that it is press fitted directly into a hole 164 provided therefor in the connector plate 120. A terminal pin 160 of the ground connector 162 is, therefore, intimately conductively coupled to the ground reference potential of the connector plate 120 and no further electrical connection need be made to the ground connector 162. Consequently, the present invention obviates the added complexity, materials and consumption of working space, as would be required to provide separate ground connector leads. Also, any number of ground connectors 162 may be provided and positioned as desired without significantly increasing the complexity of the fixture 10. As previously noted, holes 126 may be provided in the signal connector retainer plate 122 to accommodate any portion of the ground connectors 162 that extend above the connector plate 120.

The power connectors 181 (shown in FIG. 1 but not shown in FIG. 3) are of construction generally similar to that of the signal connectors 180. However, the need for an insulator insert analogous to insert 132 is obviated by the fact that the central connector plate 172 (FIG. 1) is itself an insulator. Thus, the probe of the power connector 181 is preferably press fitted directly into an appropriately dimensioned body tube analogous to the signal body tube 128. The absence of a power conductor shield, however, allows the simple connection of the decoupling capacitors 182 (FIG. 1) without risk of creating an electrical discontinuity by a breach of a ground shield. Also, the need for lengthy conductors connecting the capacitors 182 to the power connectors 181 is eliminated with the corresponding reduction of parasitic inductances introduced by the connection of the capacitors 182.

Thus, a high speed integrated circuit test fixture utilizing a coaxial connector interface to a space transformer and, thereby, realizing signal paths that are essentially free of electrical discontinuities has been described.

In the foregoing description of the structure 10, there is provided a two-dimensional array of connectors 180 interleaved with a two-dimensional array of connectors 162 contacting the upper surface of the transformer 12. Since all of the ground connectors 162 contact the connector plate 120, the return current for a signal in any one of the signal connectors 180 can pass through a plurality of the ground connectors 162. In this way it is possible for a ground return current to be uniformly distributed about the pin 136 of a signal connector 180, thereby reducing any effects of inductance and stray radiation which may be present. The benefits of the symmetry of ground return paths can also be provided in an embodiment of the invention wherein only one signal carrying probe 134 is present, as is shown in the embodiment of FIG. 4.

Figure 4:
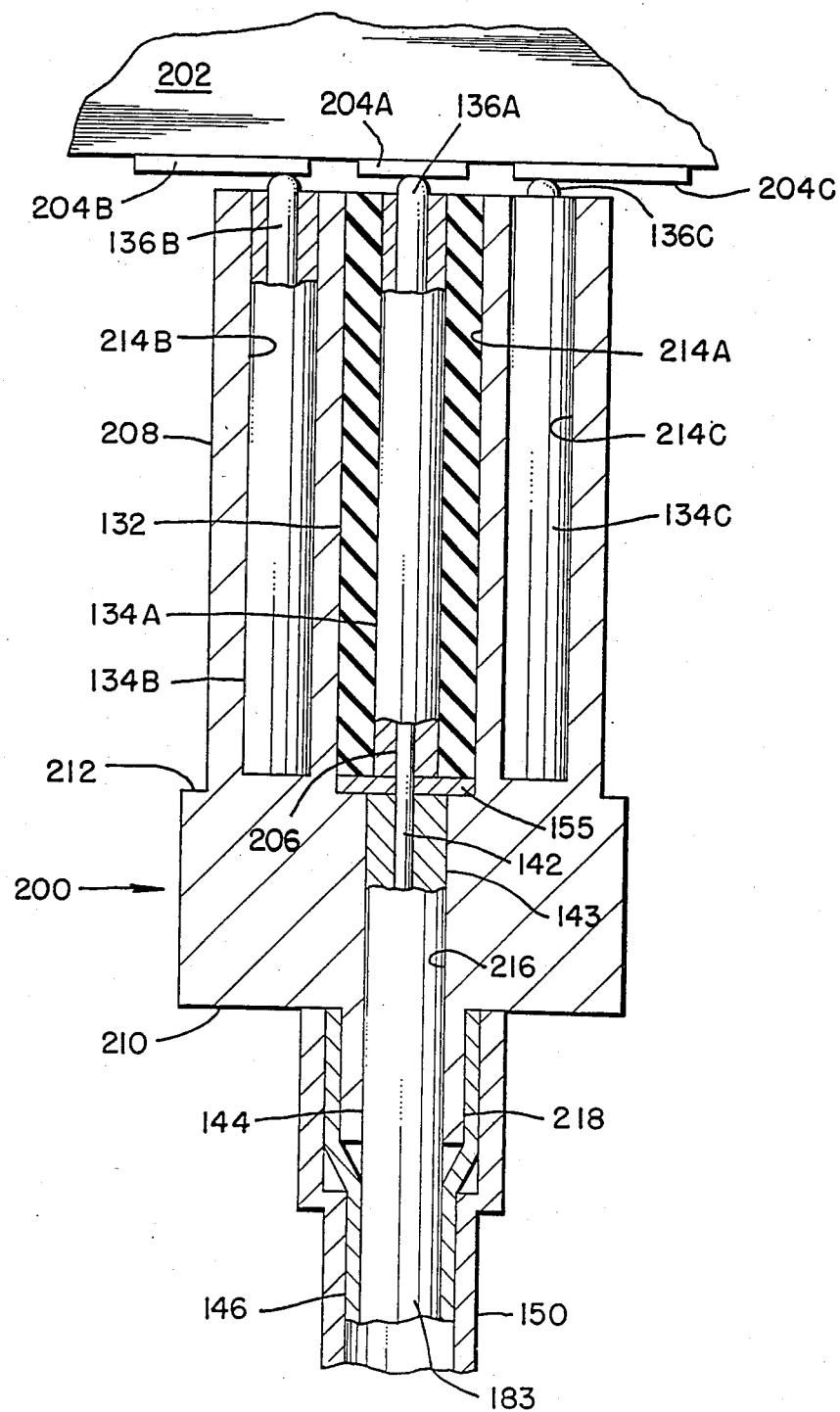
FIG. 4 shows a sectional side view of a single coaxial connector of the invention connecting with pads of an integrated circuit chip carrier.

With reference now to FIG. 4, there is shown an embodiment of the invention wherein a connector 200 comprising three probes 134, of which individual ones thereof may be further identified by the legends A, B and C when it is desired to refer to a specific one of the probes 134A-C, abuts a circuit chip carrier 202 to permit measurement of signal parameters thereof. In the use of the connector 200, the connector 200 is manually brought into contact with the chip carrier 202 such that individual pins 136 of the probes 134 contact respective ones of a set of terminal pads 204 of the chip carrier 202. Individual ones of the pins 136 and the pads 204 may be further identified by the legends A, B and C when it is desired to refer to individual ones of these elements. The connector 200 also comprises further ones of the elements previously seen in FIG. 3, namely, the sleeve 150 for holding down the shield 146 of the cable 183, the insulator insert 132 enclosing the probe 134A, and the washer 155 located between the insert 132 and the sheath 143 of the cable 183. The line conductor 142 of the cable 183 is connected by solder at 206 to the probe 134A.

The connector 200 is constructed of a housing 208 having a crown 210 at one end of the housing 208 defining a shoulder 212. The housing 208 is formed of an electrically conducting metal such as that employed in the body tube 128 of FIG. 3. Three bores 214 A-B and C are provided within the housing 208 and extend from the crown 210 to the opposite end of the housing 208. A further bore 216 communicates with the bore 214A and extends away from the bore 214A along the axis thereof through the crown 210 and through a cylindrical extension 218 of the crown 210. The probe 134A with its insulator insert 132 and washer 155 set within the bore 214A, and the probes 134B-C set within the bores 214B-C respectively. The core 144 of the cable 183 sets within the extension 218, and the shield 146 of the cable 183 is separated from the core 144 at the extension 218 to be clamped between the outer surface of the extension 218 and the inner surface of the sleeve 150.

Upon comparing the embodiments of FIGS. 3-4, it is noted the probes 134B-C of FIG. 4 provide the ground return current paths as do the ground connectors 162 of FIG. 3. While only two such ground return paths are shown in FIG. 4, additional probes 134 may be mounted in electrical contact with the housing 208 along a plane perpendicular to the plane of the probes 134B-C so as to provide axial symmetry to the flow of the ground return current about the central probe 134A. Thereby, the connector 200 provides the functions of the signal connector 120 of FIG. 3 in combination with a plurality of the ground connectors 162, all within a single housing which is positioned readily and manually upon the circuit chip carrier 202.

Figure 5:
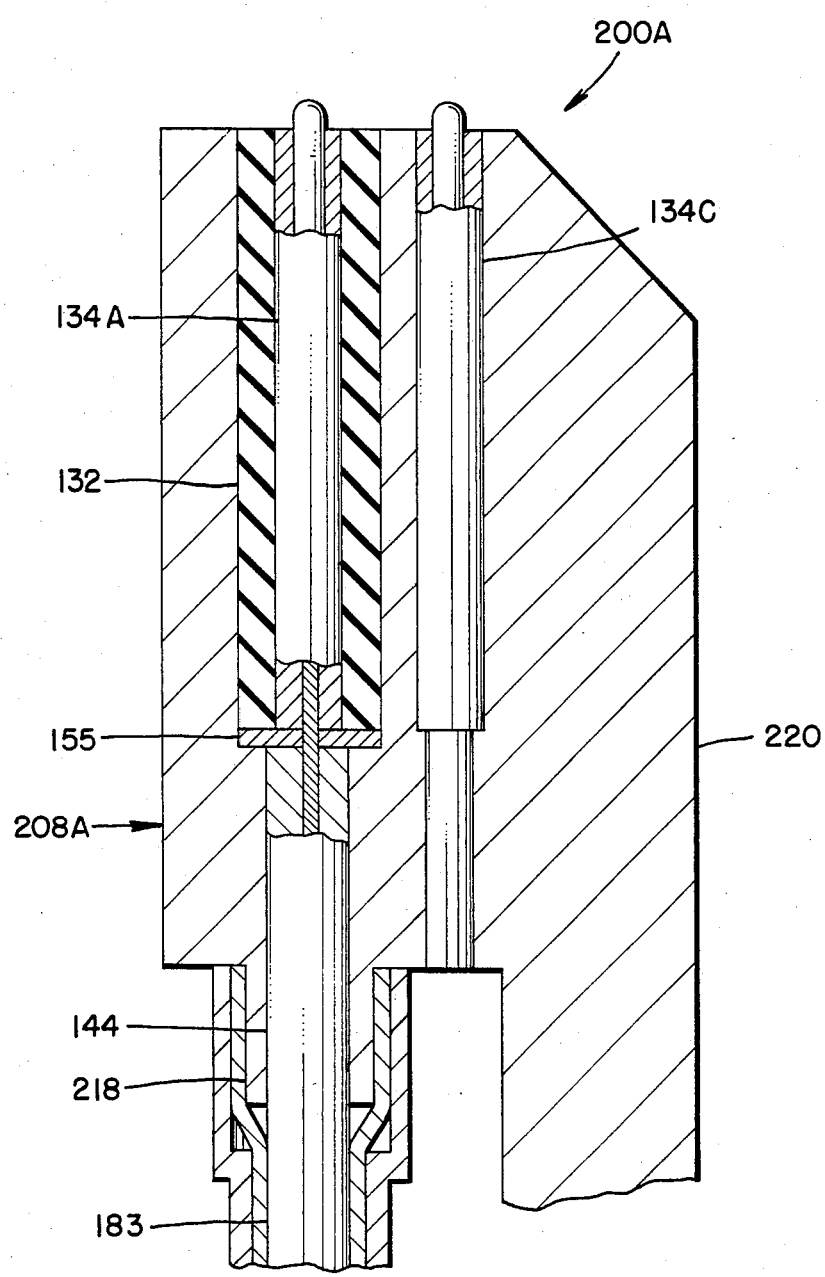
FIG. 5 shows an embodiment of the coaxial connector in accordance with the invention wherein the connector is configured as a probe.

In FIG. 5, there is shown a connector 200A which is a modification of the connector 200 of FIG. 4. One side of the connector 200A is extended to form a handle 220 to facilitate a manual grasping of the connector 200A. The connector 200A is formed of an electrically conducting metal and includes the probe 134A mounted within a housing 208A and insulated therefrom by the insert 132 for carrying electric signals from the cable 183. Also included is the probe 134C in electrical contact with the housing 208A of the connector 200A to provide the ground return path for the electric current flowing in the cable 183. While the connector 200A does not provide the symmetry of ground return, it enjoys a simplicity of structure over that of the connector 200, and is employed manually in the same manner as the connector 200.

Figure 6:
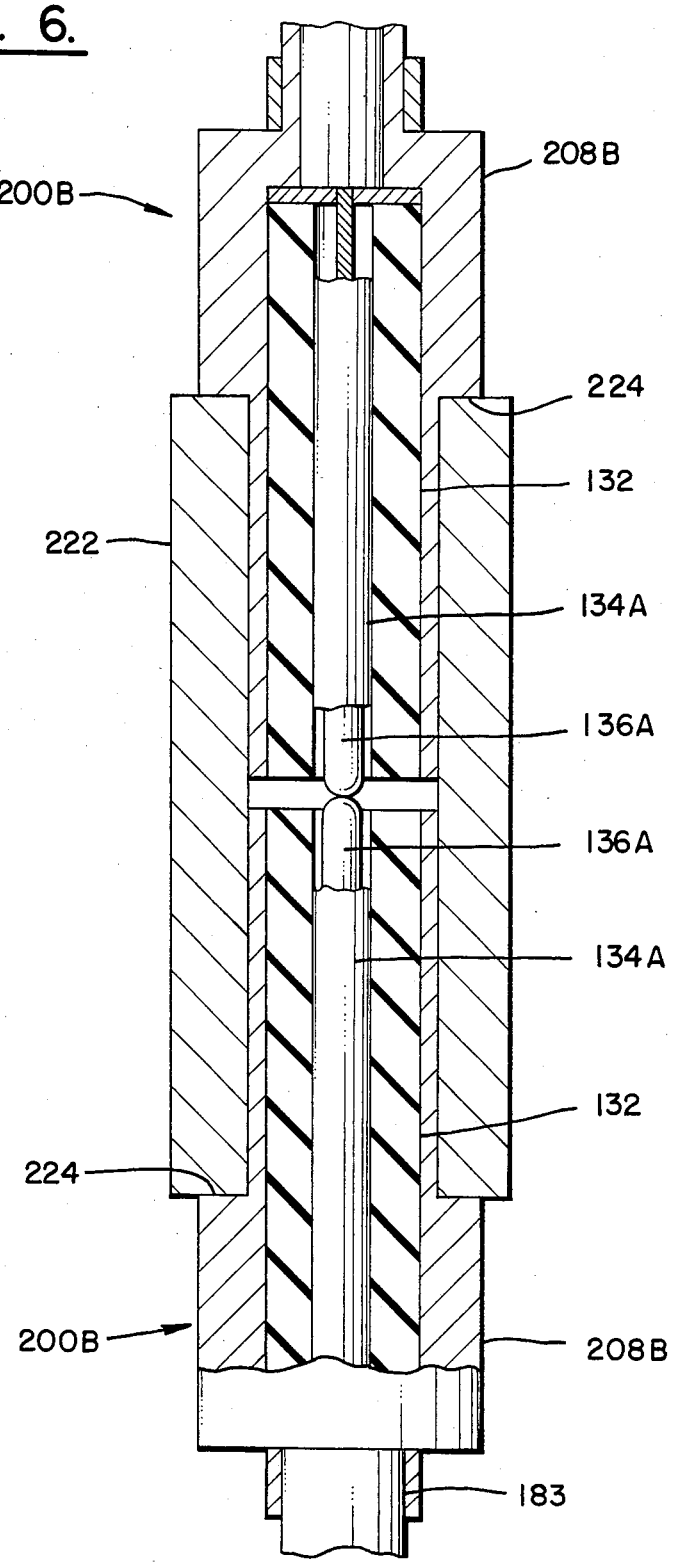
FIG. 6 shows an embodiment of the invention wherein two connectors are coupled together by a sleeve.

FIG. 6 shows a connector 200B which is a further modification of the connector 200 of FIG. 4. In FIG. 6, two of the connectors 200B are connected together by a sleeve 222, thereby to join two of the cables 183. Each of the connectors 200B comprises a housing 208B of generally cylindrical form which includes the bores 214A and 216 shown above in FIG 4. The bore 214A houses the insulator insert 132, the probe 134A and the washer 155, while the bore 216 houses the core 144 of the cable 183 as was disclosed in FIG. 4. The outer surface of each housing 208B is configured with a shoulder 224 which abuts an end of the sleeve 222 upon insertion of the connectors 200B; into opposite ends of the sleeve 222. The connectors 200B are inserted a sufficient distance for contacting opposed pins 136A of the probes 134A. The housings 208B and the sleeve 222 are fabricated of metal to provide electrical conduction between the shields 146 of the respective cables 183. The contacting of the pins 136A provides for electrical connection of the inner conductors 142 of the respective cables 183. The ground connectors 162 of the previous embodiments are not required in the embodiment of FIG. 6 because adequate secure electrical connection is provided by contact between the sleeve 222 and each of the connectors 200B. The embodiment of FIG. 6 represents a particularly useful and simple interconnection of two coaxial cables.

It is to be understood thst the abovedescribed embodiments of the invention are illustrative only, and that modifications thereof may occur to those skilled in the art. Accordingly, this invention is not to be regarded as limited to the embodiments disclosed herein, but is to be limited only as defined by the appended claims.

We claim:

1. A coaxial connector comprising:

an electrically conducting probe having a resilient electrically conducting pin extendable therefrom, said pin serving as a first terminal of said connector;

a housing enclosing said probe, said housing including an electrically conducting surface region extending continuously transversely of a longitudinal axis of said pin thereby adapting said connector to mate with an assembly having plural electrical contacts disposed on a continuous surface parallel to said transverse surface region, there being at least one pin-shaped contact spaced apart from said probe and parallel thereto and extending toward said continuous assembly surface from said transverse housing surface region to serve as a second terminal of said connector, a spacing between said probe and said one pin-shaped contact being equal to a spacing between a corresponding set of terminal contacts on said assembly, said first terminal and said second terminal extending an equal distance from the transverse surface region of said housing toward said continuous assembly surface, said housing having an elongated shape extending along the longitudinal axis of said pin from the transverse surface region of said housing;

means for insulating said probe from said second terminal; and means in said housing for directing an inner conductor of a coaxial transmission line to said first terminal and an outer conductor of said transmission line to said second terminal, said housing including electrically conducting means extending therefrom for contacting said assembly to establish a predetermined gap width between said assembly surface and said surface region for improved coupling of a signal from said assembly to said connector; and wherein said one pin-shaped contact extends within a portion of said housing and back from said transverse housing surface region, said portion of said housing extending transversely of a longitudinal axis of said housing to envelop said one-pin shaped contact to facilitate handling of said connector.

2. A connector according to claim 1 wherein said probe includes a spring for urging said pin outward of said probe, thereby to provide resilience to said first terminal, and wherein said electrically conducting means is disposed uniformly around said probe, said housing terminating in a crown at an end of the housing distant from the transverse surface region of the housing.

3. A coaxial connector interconnection system comprising:

a first connector including:

an electrically conducting probe having a resilient electrically conducting pin extendable therefrom, said pin serving as a first terminal of said connector;

a housing extending in a longitudinal direction along an axis of said probe and enclosing said probe, said housing including an electrically conducting surface region serving as a second terminal of said connector, said electrically conducting surface region extending transversely of a longitudinal axis of said pin to form a shoulder set back from an outer terminus of said pin, thereby adapting said connector to mate with a further probe of similar construction to said first-mentioned probe and having an electrical contact disposed on a surface parallel to said surface region;

means for insulating said probe from said second terminal; and means in said housing for directing an inner conductor of a coaxial transmission line to said first terminal and an outer conductor of said transmission line to said second terminal; and wherein said surface region of said housing is configured to mate with a cylindrical electrically conductive sleeve, said sleeve abutting said shoulder to maintain a gap between said housing of said first probe and a corresponding housing of said further probe, thereby to permit an interconnection of a pair of such connectors via said sleeve; and said system further comprises said sleeve and a second connector, said second connector having the same construction as said first connector to permit interconnection of said first connector with said second connector by said sleeve.

4. A connector according to claim 1 wherein said probe is disposed parallel to said longitudinal axis of said housing, said housing extending radially outward from said axis to define a shoulder to said surface region, the electrically conducting means of said connector comprising a set of probes disposed in said shoulder, each probe of said set of probes comprising a resilient electrically conducting pin electrically connected to said surface region to serve as a part of said second terminal, thereby to permit connection of said first and said second terminals with corresponding terminals of an external circuit of said assembly by a positioning of said connector at said external circuit.

5. A connector according to claim 4 wherein the probes of said set of probes are arranged symmetrically about said axis, and wherein said shoulder is retracted from the location of the pin of said first terminal to permit connection with the external circuit wherein the external circuit has a socket for reception of said first terminal.

6. A connector according to claim 1 wherein said portion of said housing extends away from said longitudinal axis of said housing to define a handle.

7. A connector according to claim 6 wherein said probe and said pin-shaped contact are located in a common plane with said handle.

8. A system for interconnecting a plurality of coaxial transmission lines to a device receiving a plurality of such transmission lines, said device having a flat surface extending transversely of said transmission lines and disposed at termini of the transmission lines of said device, said system comprising:

a set of connectors coupled to individual ones of said coaxial transmission lines; and an apertured plate for holding said connectors in registration with corresponding terminals of said device; and wherein each of said connectors comprises:

an electrically conducting probe having a resilient electrically conducting pin extendable therefrom, said pin serving as a first terminal of said connector;

a housing enclosing said probe, said housing including an electrically conducting surface region serving as a second terminal of said connector;

means for insulating said probe from second terminal; and means in said housing for directing an inner conductor of a coaxial transmission line to said first terminal and an outer conductor of said transmission line to said second terminal; and said system further comprising:

a set of signal-return probes, said plate including a set of apertures configured for receiving said signal-return probes, said signal return probes being elongated to pass through said plate in alignment with said flat surface of said device, thereby to contact signal-return terminals of said device aligned with said flat surface, each of said signal-return probes having a resilient electrically conducting pin extendable therefrom, said system including means for establishing a predetermined gap between said surfaces of said device and said plate for improved coupling of signals between said transmission lines and wherein, in each of said connectors, said probe is disposed parallel to a longitudinal axis of said housing, said housing extending radially outward from said axis to define a flange portion of said housing, a bottom portion of said flange portion abutting a top surface of said plate upon insertion of the connector within an aperture of said plate; said system further comprising a retainer configured for engagement with the flange portions of the housings fof respective ones of said connectors for holding the flange portions in abuttment with said plate.

9. A system according to claim 8 wherein each of said signal-return probes provides a ground connection, said signal-return probes being uniformly positioned about said transmission lines for further improvement in a coupling of signals between said transmission lines.

10. A system for interconnecting a plurality of coaxial transmission lines to a device receiving a plurality of such transmission lines, said device having a flat surface extending transversely of said transmission lines and disposed at termini of the transmission lines of said device, said system comprising:

a set of connectors coupled to individual ones of said coaxial transmission lines; and an apertured plate for holding said connectors in registration with corresponding terminals of said device; and wherein each of said connectors comprises:

an electrically conducting probe having a resilient electrically conducting pin extendable therefrom, said pin serving as a first terminal of said connector;

a housing enclosing said probe, said housing including an electrically conducting surface region serving as a second terminal of said connector;

means for insulating said probe from second terminal; and means in said housing for directing an inner conductor of a coaxial transmission line to said first terminal and an outer conductor of said transmission line to said second terminal; and wherein said apertured plate comprises:

a set of apertures configured for receiving the housings of respective ones of said connectors in said set of connectors, each of said housings being elongated for extending through said plate to bring the first terminals of respective ones of said connectors into into alignment with said flat surface of said device, thereby to contact corresponding signal-receiving terminals of said device;

said system further comprising:

a set of signal-return probes, said plate including a set of apertures configured for receiving said signal-return probes, said signal return probes being elongated to pass through said plate in alignment with said flat surface of said device, thereby to contact signal-return terminals of said device aligned with said flat surface, each of said signal-return probes having a resilient electrically conducting pin extendable therefrom; and wherein said plate comprises electrically conducting material interconnecting said second terminal of each of said connectors with each of said signal-return probes, a surface of said plate extending transversely of a probe of said set of connectors and joining with surfaces of housings of said connectors, said system including means for establishing a predetermined gap between said surfaces of said device and said plate for improved coupling of signals between said transmission lines; and wherein, in each of said connectors, said probe is disposed parallel to a longitudinal axis of said housing, said housing extending radially outward from said axis to define a flange portion of said housing, a bottom portion of said flange portion abutting a top surface of said plate upon insertion of the connector within an aperture of said plate; said system further comprising a retainer configured for engagement with the flange portions of the housings fof respective ones of said connectors for holding the flange portions in abuttment with said plate.

11. A system according to claim 10 wherein each of said signal-return probes is press-fit into a respective aperture of said plate.

12. A system according to claim 11 wherein said retainer incorporates apertures by which access is had with respective ones of said connectors and respective ones of said signal-return probes.

13. A system according to claim 12 wherein, in each of said connectors, said insulating means is constructed as a cylindrical insert disposed between an outer surface of said probe and an inner surface of said housing.

14. A system according to claim 8 wherein said connectors are positioned in a first array by said apertured plate, and wherein said signal-return probes are positioned in a second array by said apertured plate, the connectors of said first array being interleaved among the probes of said second array to provide a uniform distribution of signal-return electric currents about signal currents flowing through the pins of respective ones of said connectors.

15. A system according to claim 14 wherein a mounting of each of said connectors within said plate and a mounting of each of said signal-return probes within said plate provides for a uniform extension of the pins of said connectors and the pins of said signal-return probes beyond a surface of said plate to permit contact with corresponding terminals of said device upon a positioning of said plate adjacent said device.

16. A system according to claim 15 wherein each of said transmission lines is a coaxial cable.

* * * * *